Figure 1:
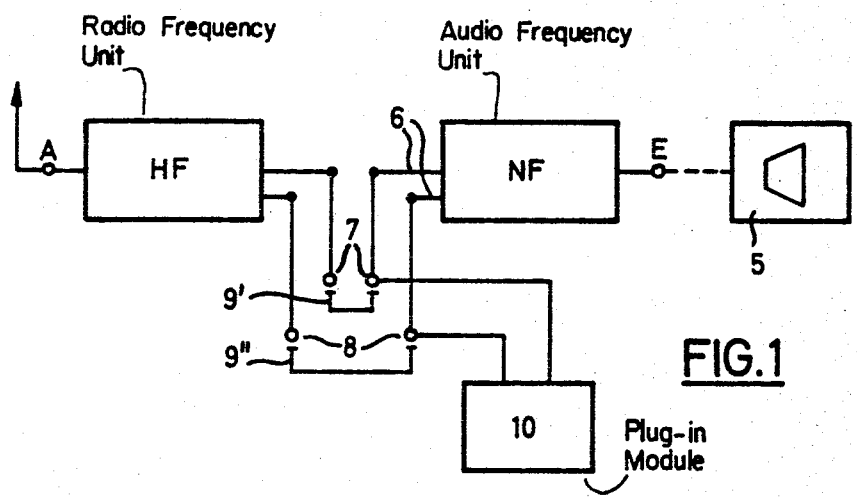

United States Patent
Martiny et al.

[11] 4,131,851
[45] Dec. 26, 1978

[54] RADIO-SIGNAL RECEIVER WITH PLUG-IN MODULES

[75] Inventors: Wolfgang Martiny, Lampertheim, Fed. Rep. of Germany; Donald H. MacGillavry, Reithoven, Belgium

[73] Assignee: BASF Aktiengesellschaft, Ludwigshafen, Fed. Rep. of Germany

[21] Appl. No.: 717,409

[22] Filed: Aug. 24, 1976

[30] Foreign Application Priority Data

Mar. 1, 1976 [DE] Fed. Rep. of Germany ........ 2608359

[51] Int. Cl.² ............................................. H04B 1/08
[52] U.S. Cl. ................................ 325/355; 361/395; 361/399
[58] Field of Search ............... 325/355, 356; 361/392, 361/393, 394, 395, 399, 352, 422

[56] References Cited

U.S. PATENT DOCUMENTS

| Re. 25,317 | 1/1963  | McCoy            | 325/355 |
| 2,922,043  | 1/1960  | Decker et al.    | 325/355 |
| 2,963,577  | 12/1960 | Errichiello et al.| 325/355 |
| 3,054,024  | 9/1962  | Dillen et al.    | 325/355 |
| 3,396,313  | 8/1968  | Payne            | 361/395 |
| 3,524,198  | 8/1970  | Malmstadi et al. | 361/395 |
| 3,603,845  | 9/1971  | Beers            | 361/399 |
| 3,769,552  | 10/1973 | Cook et al.      | 361/393 |
| 3,899,720  | 8/1975  | Peterson         | 361/393 |
| 3,950,677  | 4/1976  | Klein et al.     | 361/395 |

FOREIGN PATENT DOCUMENTS

| 70438  | 8/1956 | France         | 361/395 |
| 939582 | 6/1959 | United Kingdom | 361/394 |

OTHER PUBLICATIONS

Heath's Digital FM Tuner, Radio Electronics, May 1973, pp. 42–45, 50 & 98, by David M. Thomas.

*Primary Examiner*—Robert L. Griffin
*Assistant Examiner*—Tommy P. Chin
*Attorney, Agent, or Firm*—Keil, Thompson & Shurtleff

[57] ABSTRACT

A receiver for radio signals, comprising an r-f (radio-frequency) unit and an a-f (audio-frequency) unit, the circuit in the a-f unit being interrupted at certain points and the receiver being devised electrically and with respect to its spatial design in such a way that, by changing modules accommodated within the spatial confines of the receiver case, completely different technical versions of the receiver are obtained.

13 Claims, 3 Drawing Figures

RADIO-SIGNAL RECEIVER WITH PLUG-IN MODULES

The invention relates to a radio-signal receiver comprising an r-f unit and a-f unit in one and the same case, the circuits in the a-f unit being interrupted at certain points and connectible by connecting means at circuit contacts accessible from without the case.

Receivers are known in which, in the a-f unit or, more precisely, between the preamplifier and the output amplifier stages the connecting leads are interrupted and taken out to terminal sockets. In normal operation, the sockets may be connected by shorting links, for example and, if desired, accessories such as echo chambers or special tone control networks can be connected to these sockets. Such link-up external units are unattractive from the aesthetic as well as the electrical point of view. It is difficult to achieve attractive combinations of compact receiver sets with accessory modules of this type. Besides, their connection requires screened cables.

In the field of measuring instruments, plug-in units for measuring equipment are known, for example, for oscilloscopes, with a view to widening the applicability of these comparatively expensive instruments and to making their operation considerably less expensive.

The present invention has for its object to widen the applications of receivers of the type referred to by providing economic embodiments of spatially advantageous design.

According to the invention this object is achieved for a radio-signal receiver comprising an r-f unit and an a-f unit in one and the same case with interruption of the circuits in the a-f portion at certain points which are connectible by connecting means at circuit contacts accessible from without the case, by arranging these contacts in at least one recess of the case and by devising the connecting means in the shape of plug-in modules provided with connecting contacts allocated to the circuit contacts, the modules comprising circuit arrangements supplementing the existing a-f unit.

This enables a receiver being equipped with interchangeable accessory or special circuit units, without the need for connection by cable or for producing unattractive contraptions.

In a preferred embodiment of the invention, the module may resemble the shape of a book, while the recess of the receiver case is a cube-shaped cavity. In this way, a module/receiver set combination may be obtained which is easy to manipulate and which allows the stowing away of the module in the manner of a book being placed on a shelf between other books.

Preferably, the module is provided with connecting contacts on the narrow face which forms the underside when it has been inserted in the receiver, whereas the circuit terminals in the set may be provided at the bottom surface of the recess.

It is advantageous in practice to provide the recess in the upper wall of the case. This makes it possible to fit the module to the set in easily accessible and interchangeable manner.

Advantageously, the module comprises a quadrophonic decoding circuit, a noise reduction or noise suppression circuit, a stereo fan-out, an a-f amplifier stage and/or an echo device.

The invention is further illustrated with reference to the accompanying drawings in which FIG. 1 shows a block diagram of a receiver assembly according to the invention FIG. 2 a module devised according to the invention FIG. 3 a module according to FIG. 2 and a receiver unit with the recess housing the module according to the invention.

FIG. 1 shows a receiver assembly from which all the circuits and power supplies of no interest in this context have been omitted, the aerial input A with an arrow as the aerial symbol, then the radiofrequency stage denoted by the letters "HF" (r-f), then the audiofrequency unit denoted by the letters "NF" (a-f) which, amongst other things, comprises the preamplifier and output amplifier stages, and finally the output terminal E to which one or more loudspeakers 5 can be connected.

The connecting leads 6 between the r-f unit and the a-f unit are interrupted in the drawing, in order to demonstrate the connectability and feasibility of connecting a further circuit unit, referred to below as module 10 whose possible design will still be further described below. The terminal pairs 7 and 8 are in this embodiment connected to one another when the module 10 is inserted; at the same time, the circuit unit contained therein is connected in parallel with the r-f and a-f units of the receiver. Series connection between the units or within the a-f stage, for example between a preamplifier and an output amplifier is of course equally simple to accomplish. In the case described here, the terminal pairs 7 and 8 are separated from one another, the connection between the r-f and the a-f units remains interrupted until it is closed by the shorting links 9' and 9" provided in or on the module 10 as the latter is inserted.

Figure 2:
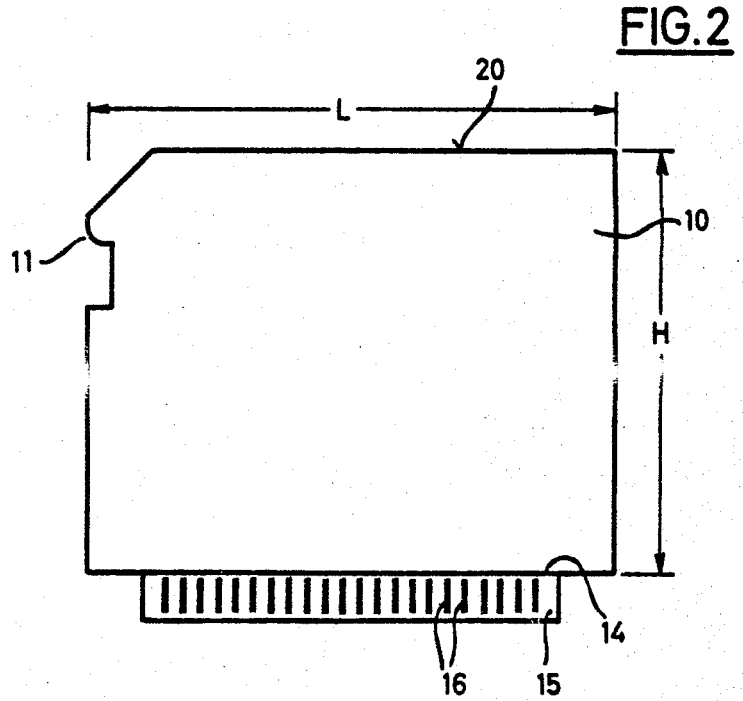
Figure 3:
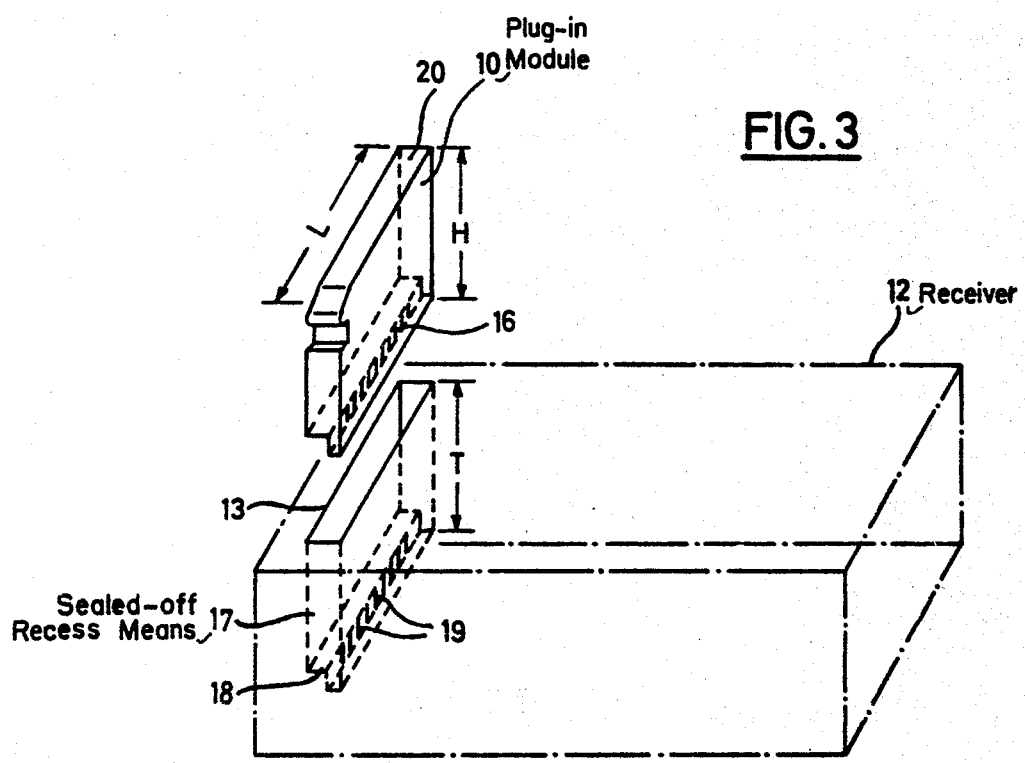

FIG. 2 shows an embodiment of module 10 of roughly parallel-epipedic or box shape, enclosed on all sides, this module being also shown in perspective representation in FIG. 3, above a receiver case 12. A grip-shaped edge 11 simplifies the removal of module 10, provided that the surface aperture 13 in the case 12 is longer than the module 10 by an amount sufficient for a finger to be introduced in the intervening space. On its underside 14, the module 10 has a terminal strip 15 with contacts 16 which corresponds to a strip 18 comprising the receiver-associated contacts 19 in the receiver case 12 at the bottom of the recess 17, so that, after the module 10 has been inserted in the recess 17, matching contacts 16 and 19 are being electrically connected. The contacts 19 could also be arranged on the chassis of the receiver. The recess is preferably sealed from the interior of the set. The recess 17 is provided asymmetrically in the upper side of the case 12 on the left, but it could equally well be provided in any other suitable area. The height H of the module 10 corresponds to the depth T of the recess, so that the top face of the receiver case is flush with the top surface 20 of the module when the latter has been inserted. The term "is flush with" should be understood to mean that a substantially flush position would be considered sufficient; in other words, slightly protruding walls in either direction need not be excluded. In this way, a technically satisfactory and, at the same time, attractive solution can be achieved. In the various claims, further embodiments of the module/receiver case combination have been indicated. Thus, gripping edges or indentations may be provided near wall 20, for example on the longitudinal faces of the module 10. In any case, the aperture 13 of the recess should obviously be shaped so as to facilitate gripping the module 10. Basically, the module may be given any desired shape as long as it facilitates manipulation and simple insertion. It is possible to adapt the receiver set to the given shape of the module, or vice versa. Similarly, the free choice of the design and arrangement of the connection and circuit contacts is determined only by considerations of usefulness and economy.

Basically it is possible spatially to integrate and, at the same time, couple electrically in a simple manner a large number of different circuits contained in the module of the invention to a receiver set likewise devised according to the invention, by using the above-described or a similar plug-in design. By using a suitable hi-fi circuit arrangement, reception and reproduction may be ideally adapted to any audio-technical condition, conceivable at present or in the future, of received radio signals or of the signals of an employed recording medium which are to be reproduced. This means that the signals may be decoded according to the coding originally employed and may be improved or altered. The circuit to be employed may thus be a quadrophonic decoding circuit such as employed in the various quadrophonic systems meanwhile disclosed. Such systems are for example the SQ (matrix) system of SQ-matrix quadrophonic records or recorded compact cassettes, the SQ (full logic) system, the CD4 system with accurately separated four-channel signal transmission up to the loudspeakers, or the UD4 system. According to the invention it is now possible to employ not only one of the selectable quadrophonic systems, but also to change between systems according to choice or need, simply by exchanging modules.

To improve the signal, it is possible to use either one of the known noise suppression systems, such as a DNL (dynamic noise limiter) circuit or a Dolby noise suppression circuit, the latter offering considerable improvement of the signal transmission dynamics. In transmitters, the Dolby system is already being used in the VHF range. Music cassettes produced according to the Dolby method are likewise known. In order to improve the signals at will, it is possible, for example, to use an echo chamber or special tone control networks in which the signal frequencies are selectively attenuated or emphasized in a module according to the invention, or add or exchange additional output amplifying stages, for example to convert stereo equipment into quadrophonic equipment, for instance by choosing different output conductors. Obviously it is also possible suitably to combine associated or matching systems in one and the same module, such as an SQ (matrix) circuit, in particular for the special reproduction of certain records, music cassettes and accordingly coded and/or noise-suppressed radio broadcasts. Another advantageous possibility provides for dummy modules with suitable connecting contacts which link the various stages of the receiver in the proper order, so as to be able to produce a coherent receiver case also if supplementary, modifying and/or expanding modules are not available. Obviously, another possibility consists in providing for a given recess in the receiver case one single module as well as several smaller modules which, together, occupy the same volume. These modules may advantageously be provided with suitable connecting contacts. Another advantageous solution provides for these smaller modules to have additional connection contacts, arranged for instance in adjacent walls and connected to one another directly, for example prior to the common insertion in the recess. Finally, it would also be possible to provide in the upper face of the receiver case several recesses, independent of, and spaced apart from, one another and to use modules matching these recesses.

A number of other useful circuit combinations are conceivable. For example, the module may contain a remote-control device or an alarm device. The proper point in the a-f circuit of the receiver to which the module of the invention has to be coupled will be obvious to those skilled in the art.

We claim:

1. A radio-signal receiver comprising a radio-frequency portion and also an audio-frequency portion including a basic audio-frequency unit, said radio-frequency portion and said basic audio-frequency unit being mounted in the interior of a common housing, said housing being provided with recess means accessible from the outside of the housing, said recess means, being sealed off from the interior of the housing and receiving at least one modular plug-in unit having the components of one or more auxiliary circuit modules enclosed therein, and said modular unit having thereon a plurality of contacts cooperating with a plurality of mating contacts in said recess means of the housing which are connected to circuit points in said audio-frequency portion, the circuit through at least predetermined ones of said circuit points being normally interrupted and at least one of said enclosed modular plug-in units being provided with linking connections for bridging said predetermined circuit points when said modular unit is inserted into said recess means of said housing, such that said modular unit, upon being plugged in, effectively supplements said basic audio-frequency unit, circuitwise, with said auxiliary circuit module.

2. A receiver as claimed in claim 1, wherein said auxiliary circuit module comprises a quadrophonic circuit.

3. A receiver as claimed in claim 1, wherein said auxiliary circuit module comprises a noise suppression circuit.

4. A receiver as claimed in claim 1, wherein said auxiliary circuit module comprises a stereo fan-out circuit.

5. A receiver as claimed in claim 1, wherein said auxiliary circuit module comprises an echo device.

6. A receiver as claimed in claim 1, wherein said first-mentioned contacts are provided substantially at an end face of said modular unit and said mating contacts substantially at the bottom of said recess means.

7. A receiver as claimed in claim 6, wherein said mating contacts are provided in the receiver chassis.

8. A receiver as claimed in claim 1, wherein said recess means opens into the upper face of said housing.

9. A receiver as claimed in claim 1, wherein said modular unit is book-shaped and wherein said recess means of the housing is of substantially parallelepipedic shape.

10. A receiver as claimed in claim 1, wherein the opening of said recess means is substantially closed when said modular unit is positioned therein.

11. A receiver as claimed in claim 1, wherein said recess means is dimensioned so as to enable the modular unit, after having been positioned in the recess means, to be gripped and removed therefrom.

12. A receiver as claimed in claim 11, wherein said modular unit is provided with gripping means for facilitating its removal from said recess means.

13. A receiver as claimed in claim 12, wherein said gripping means comprises an indentation adjacent and end wall of said modular unit, said end wall substantially closing the opening of said recess means when said modular unit is positioned therein.

* * * * *